United States Patent
Hinnen et al.

(10) Patent No.: US 10,474,039 B2
(45) Date of Patent: Nov. 12, 2019

(54) METHODS AND PATTERNING DEVICES AND APPARATUSES FOR MEASURING FOCUS PERFORMANCE OF A LITHOGRAPHIC APPARATUS, DEVICE MANUFACTURING METHOD

(71) Applicant: ASML Netherlands B.V., Veldhoven (NL)

(72) Inventors: Paul Christiaan Hinnen, Veldhoven (NL); Simon Gijsbert Josephus Mathijssen, Rosmalen (NL); Maikel Robert Goosen, Eindhoven (NL); Maurits Van Der Schaar, Eindhoven (NL); Arie Jeffrey Den Boef, Waalre (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 15/384,084

(22) Filed: Dec. 19, 2016

(65) Prior Publication Data
US 2017/0176870 A1    Jun. 22, 2017

(30) Foreign Application Priority Data
Dec. 21, 2015   (EP) ..................................... 15201611

(51) Int. Cl.
*G03B 27/34*        (2006.01)
*G03F 7/20*         (2006.01)

(52) U.S. Cl.
CPC .......... *G03F 7/70525* (2013.01); *G03F 7/702* (2013.01); *G03F 7/7085* (2013.01); *G03F 7/70641* (2013.01); *G03F 7/70683* (2013.01)

(58) Field of Classification Search
CPC .. G03F 7/702; G03F 7/70525; G03F 7/70641; G03F 7/70683; G03F 7/7085
(Continued)

(56) References Cited

U.S. PATENT DOCUMENTS 6,777,139 B2    8/2004   Baselmans
6,967,719 B2    11/2005  Sato et al.
(Continued)

FOREIGN PATENT DOCUMENTS

JP    2003022968 A    1/2003
JP    2003142385 A    5/2003
(Continued)

OTHER PUBLICATIONS

International Search Report and Written Opinion of the International Searching Authority directed to related International Patent Application No. PCT/EP2016/079948, dated Apr. 13, 2017; 13 pages.
(Continued)

*Primary Examiner* — Peter B Kim
(74) *Attorney, Agent, or Firm* — Sterne, Kessler, Goldstein & Fox P.L.L.C.

(57) ABSTRACT

A lithographic apparatus (LA) prints product features and at least one focus metrology pattern (T) on a substrate. The focus metrology pattern is defined by a reflective reticle and printing is performed using EUV radiation (404) incident at an oblique angle ($\theta$). The focus metrology pattern comprises a periodic array of groups of first features (422). A spacing (S1) between adjacent groups of first features is much greater than a dimension (CD) of the first features within each group. Due to the oblique illumination, the printed first features become distorted and/or displaced as a function of focus error. Second features 424 may be provided as a reference against which displacement of the first features may be seen. Measurement of this distortion and/or displacement may be by measuring asymmetry as a property of the printed pattern. Measurement can be done at longer wavelengths, for example in the range 350-800 nm.

17 Claims, 7 Drawing Sheets

(58) Field of Classification Search
USPC .......................................................... 355/55
See application file for complete search history.

(56) References Cited

U.S. PATENT DOCUMENTS

| | | |
|---|---|---|
| 7,916,284 B2 | 3/2011 | Dusa et al. |
| 8,085,393 B2 | 12/2011 | Kasa et al. |
| 9,182,682 B2 | 11/2015 | Cramer et al. |
| 9,519,224 B2 | 12/2016 | Gijsbertsen et al. |
| 2003/0048458 A1 | 3/2003 | Mieher et al. |
| 2003/0117627 A1 | 6/2003 | Sato et al. |
| 2004/0114132 A1 | 6/2004 | Den Boef et al. |
| 2004/0119970 A1 | 6/2004 | Dusa et al. |
| 2006/0033921 A1 | 2/2006 | Den Boef et al. |
| 2008/0018874 A1 | 1/2008 | Dusa et al. |
| 2009/0021711 A1 | 1/2009 | Sato et al. |
| 2009/0268182 A1* | 10/2009 | Staals .................... G03B 27/32 355/53 |
| 2009/0296058 A1 | 12/2009 | Slotboom et al. |
| 2010/0081093 A1 | 4/2010 | Kasa et al. |
| 2010/0201963 A1 | 8/2010 | Cramer et al. |
| 2010/0328636 A1 | 12/2010 | Quaedackers et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2011/0249247 A1 | 10/2011 | Cramer et al. |
| 2012/0044470 A1 | 2/2012 | Smilde et al. |
| 2012/0123581 A1 | 5/2012 | Smilde et al. |
| 2013/0001442 A1* | 1/2013 | Schepers ............. G03F 7/70033 250/492.22 |
| 2013/0258310 A1 | 10/2013 | Smilde et al. |
| 2013/0271740 A1 | 10/2013 | Quintanilha |
| 2016/0033879 A1 | 2/2016 | Raghunathan et al. |
| 2016/0291482 A1 | 10/2016 | Shih et al. |

FOREIGN PATENT DOCUMENTS

| | | |
|---|---|---|
| JP | 2008028389 A | 2/2008 |
| JP | 2010087166 A | 4/2010 |
| JP | 2012515431 A | 7/2012 |
| JP | 2014531131 A | 11/2014 |
| WO | WO 2013/178422 A1 | 12/2013 |
| WO | WO 2014/146906 A2 | 9/2014 |
| WO | WO 2015/062854 A1 | 5/2015 |
| WO | WO 2015/090839 A1 | 6/2015 |
| WO | WO 2015090839 A1 | 6/2015 |

OTHER PUBLICATIONS

Office Action directed to Japanese Counterpart Patent Application No. 2018-532671, dated Jul. 10, 2019, with attached English-Language translation; 15 pages.

\* cited by examiner

METHODS AND PATTERNING DEVICES AND APPARATUSES FOR MEASURING FOCUS PERFORMANCE OF A LITHOGRAPHIC APPARATUS, DEVICE MANUFACTURING METHOD

BACKGROUND

Field of the Invention

The present invention relates to inspection apparatus and methods usable, for example, to perform metrology in the manufacture of devices by lithographic techniques. The invention further relates to such methods for monitoring a focus parameter in a lithographic process.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy settings were determined from examination of those test structures. More recently, focus metrology targets are included in the production designs, to allow continuous monitoring of focus performance. These metrology targets should permit rapid measurements of focus, to allow fast performance measurement in high-volume manufacturing. Ideally, the metrology targets should be small enough that they can be placed among the product features without undue loss of space.

Current test structure designs and focus measuring methods have a number of drawbacks. Known focus metrology targets require sub-resolution features or grating structures with large pitches. Such structures may contravene design rules of the users of lithographic apparatuses. For EUV lithography, where printing is performed using radiation of a wavelength less than 20 nm, for example 13.5 nm, the creation of sub-resolution features may not be possible. Asymmetry in a grating structure can be measured effectively using high-speed inspection apparatus such as a scatterometer, working at visible radiation wavelengths. Known focus measuring techniques exploit the fact that focus-sensitive asymmetry can be introduced into structures printed in a resist layer by special design of the patterns on a patterning device that defines the target structure. For EUV lithography, resist thickness, and therefore the thickness of target structures, is smaller. For these reasons, there is a need to develop new techniques for the measurement of focus performance in lithographic processes.

SUMMARY OF THE INVENTION

The present invention aims to provide methods of measuring focus performance that are adaptable to new environments, such as EUV lithography. The inventors have recognized that the three-dimensional nature of interaction between the EUV radiation and a reflective type of patterning device leads to a focus sensitivity in the positioning of fine features, even though such features are within the printing resolution of the lithographic apparatus. This position sensitivity can be used to create focus metrology patterns whose asymmetry is sensitive to focus, without the need to violate design rules, or to include sub-resolution features.

The invention in a first aspect provides method of measuring focus performance of a lithographic apparatus, the method comprising:

(a) using the lithographic apparatus to print at least one focus metrology pattern on a substrate, the printed focus metrology pattern comprising an array of features that is periodic in at least one direction;

(b) measuring a property of the printed focus metrology pattern; and (c) deriving a measurement of focus performance from the measurement of said property, wherein the focus metrology pattern is defined by a patterning device and the printing in step (a) is performed by illuminating said patterning device with patterning radiation incident at an oblique angle, and wherein the focus metrology pattern comprises a periodic array of groups of first features, each group comprising one or more first features and wherein a spacing between adjacent groups of first features within the focus metrology pattern is much greater than the dimension of each first feature in the direction of periodicity.

Such a pattern when printed using oblique illumination of a patterning device will exhibit distortions and/or displacement of the first features in a manner dependent on focus error. Measurement of asymmetry in a printed pattern is one convenient method of measuring the focus-dependent distortion and/or displacement of the pattern obtained using the patterning device with first features. Other methods may be deployed, if preferred.

The number of first features within each group of first features may be as few as one, or it may be two or more.

The invention yet further provides a patterning device for use in a lithographic apparatus, the patterning device comprising reflective and non-reflective portions to define features of one or more device patterns and one or more metrology patterns, the metrology patterns including at least one focus metrology pattern, each group comprising one or more first features and wherein a spacing between adjacent groups of first features within the focus metrology pattern is much greater than the dimension of each first feature in the direction of periodicity.

The invention yet further provides metrology apparatus for measuring a parameter of a lithographic process, the metrology apparatus being operable to perform steps (b) and (c) of the method according to the invention as set forth above.

The invention yet further provide a lithographic system comprising a lithographic apparatus comprising:

an illumination optical system arranged to illuminate a reflective patterning device;

a projection optical system arranged to project an image of the patterning device onto a substrate; and a metrology apparatus according to the invention as set forth above, wherein the lithographic apparatus is arranged to use the measurement of focus performance derived by the metrology apparatus when applying the pattern to further substrates.

The invention yet further provides computer program products for use in implementing methods and apparatuses according to various aspects of the invention as set forth above.

The invention yet further provides a method of manufacturing devices using the method according to the invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
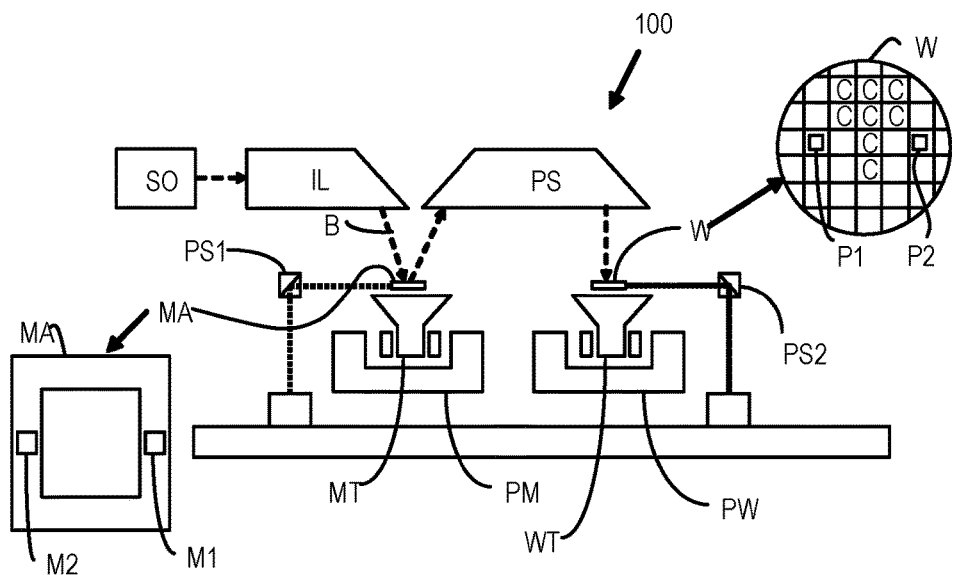
FIG. 1 depicts a lithographic apparatus having a reflective patterning device.

FIG. 1 schematically depicts a lithographic apparatus 100 including a source module SO according to one embodiment of the invention. The apparatus comprises:

an illumination system (illuminator) IL configured to condition a radiation beam B (e.g. EUV radiation).

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

In general patterning devices used in lithography may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask). The focus metrology techniques of the present disclosure have been developed particularly for use with reflective patterning devices (reticles), where illumination is not in a direction normal to a plane of the patterning device surface, but at a slightly oblique angle. In principle, the same techniques could apply in relation to a transmissive patterning device, if for some reason illumination introduced asymmetry. Conventionally, illumination of the reticle is designed to be symmetrical, but with reflective reticles, that is not generally possible.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It will be understood that the lithographic apparatus is represented in FIG. 1 in a highly schematic form, but that is all that is necessary for the present disclosure.

Figure 2:
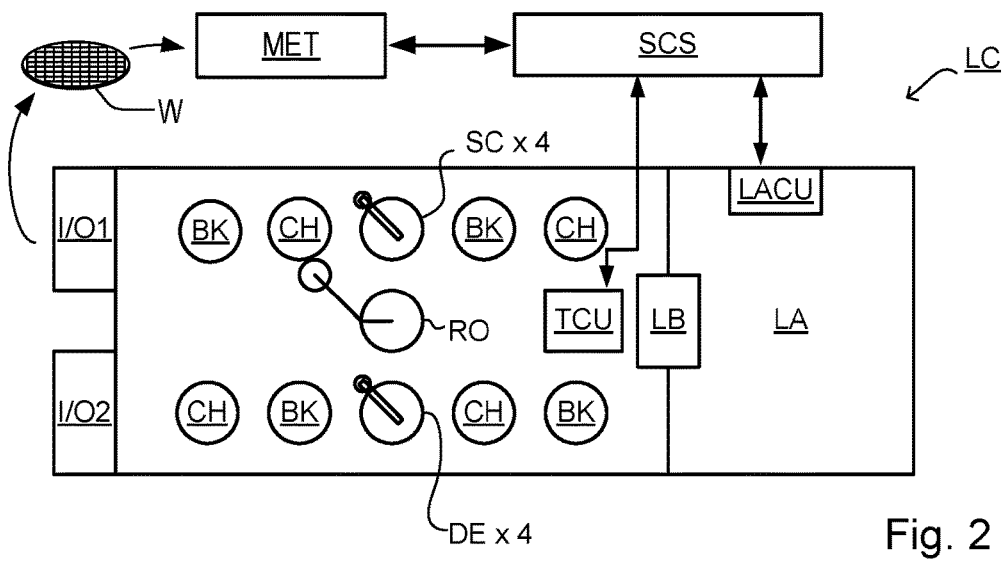
FIG. 2 depicts a lithographic cell or cluster in which a lithographic apparatus and metrology apparatus can be used to perform methods according to the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3A:
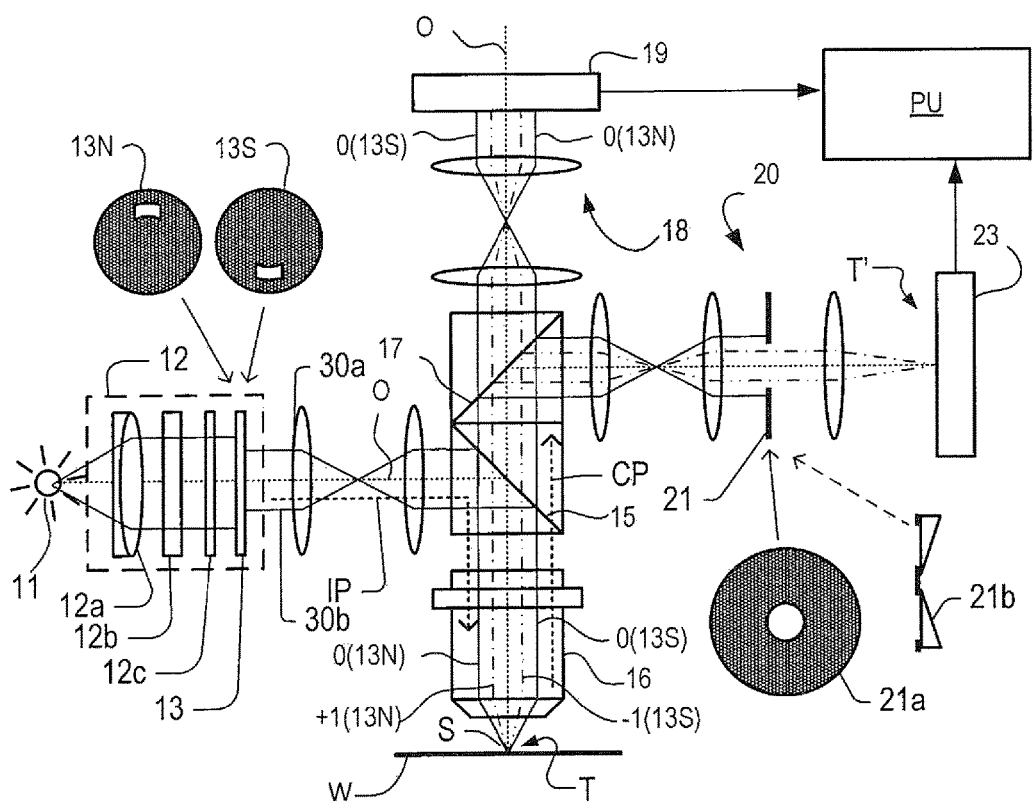
FIGS. 3A-3B illustrate schematically an inspection apparatus adapted to perform angle-resolved scatterometry and dark-field imaging inspection methods.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(b).

As described in the prior applications cited in the introduction, the dark-filed-imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system, a color filter, a polarizer and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example as a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

Figure 3B:
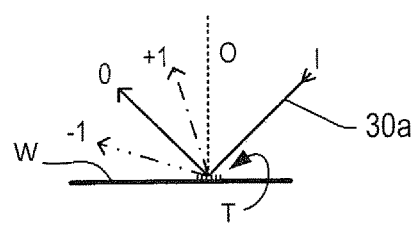

In a first example illumination mode, aperture 13N is used and rays 30a are provided so that the angle of incidence is as shown at 'I' in FIG. 3(b). The path of the zero order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 3(a), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 20 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(b) and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30a, and so the −1 order diffracted rays enter the objective and contribute to the image. Aperture stop 21a blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

In the following disclosure, techniques will be illustrated for measuring focus performance of a lithographic process that uses oblique illumination on a reflective type of patterning device. These techniques may be applied in particular in EUV lithography, where reflective optics in a near-vacuum environment are required. Metrology targets including certain focus metrology patterns will be printed on the substrate, at the same time as product features are printed. Asymmetry in these printed patterns will be measured using for example diffraction based techniques in the apparatus of FIG. 3. To allow the use of small targets, it will be assumed that these asymmetry measurements will be performed using the dark-field imaging branch of the apparatus. Diffraction-based measurements of asymmetry can also be made using the pupil imaging branch, however. Of course, the apparatus shown in FIG. 3 is only one example of an inspection apparatus and method that may be used to measure asymmetry.

In the context of lithographic apparatuses working in the DUV wavelength range, targets for diffraction-based focus (DBF) measurements have been designed and used successfully. A known type of DBF target is produced by including sub-segmented features in a grating pattern on the reticle. These features have dimensions below the imaging resolution of the lithographic apparatus, alongside more solid features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently a metrology tool such as the inspection apparatus of FIG. 3 can measure the degree of asymmetry from a target formed on the substrate, and translate this into the scanner focus.

Unfortunately, the known DBF metrology target designs are not suitable for use in all situations. In EUV lithography, resist film thicknesses are significantly lower than those used in DUV immersion lithography, which makes it difficult to extract accurate asymmetry information from the asymmetric profile of the structures forming part of a target. In addition, since the resolution of the imaging system is inherently higher in EUV lithography, features having dimensions below the printing resolution of DUV immersion lithography become "solid" features printable by EUV lithography. To provide analogous sub-resolution features on an EUV reticle is not generally feasible, and/or may violate semiconductor manufacturer's "design rules". Such rules are generally established as a means to restrict the feature designs to ensure the printed features conform to their process requirements. In any case, working outside the design rules makes it difficult to simulate the performance of the process on the DBF targets, so that the optimum target design and the calibration of focus measurements becomes a matter of trial-and-error.

Figure 4:
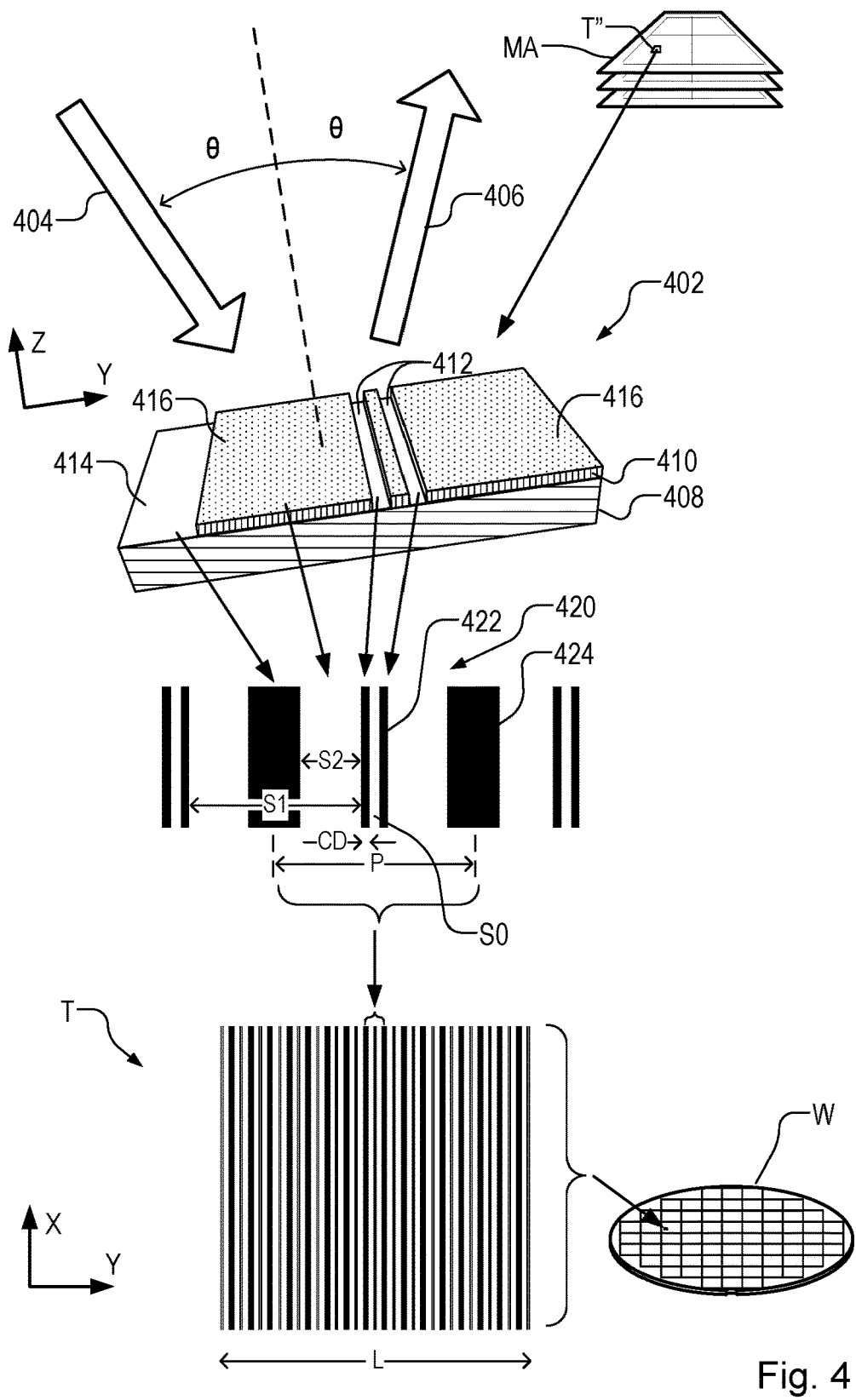
FIG. 4 illustrates the formation of a focus metrology target on a substrate using a reflective patterning device in one embodiment of the present invention.
Figure 5A:
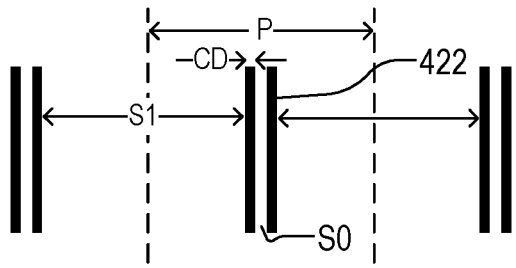
FIGS. 5A-5E show schematically, detail of five example focus metrology patterns (a) to (e)
Figure 5B:
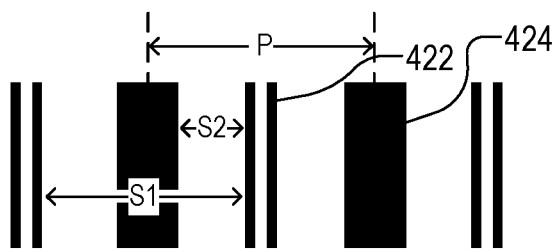
Figure 5C:
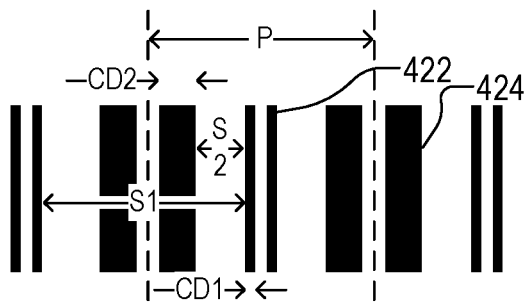
Figure 5D:
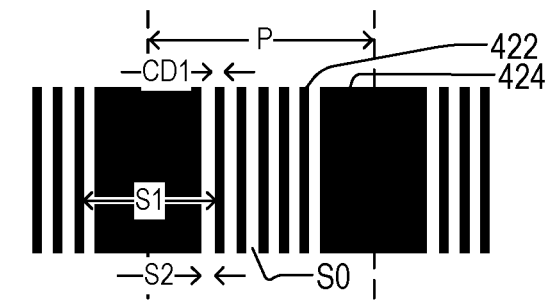
Figure 5E:
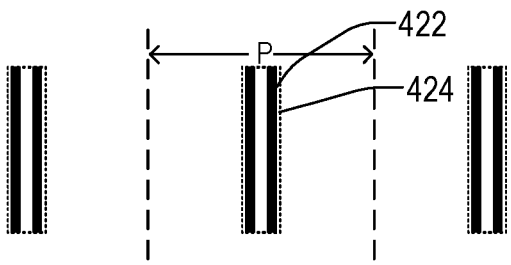

FIG. 4 illustrates the principles of a method of measuring focus performance of a lithographic apparatus according to the present disclosure. In the disclosed method, the lithographic apparatus is used to print at least one focus metrology pattern T on a substrate W. The printed focus metrology pattern T comprises an array of features that is periodic in at least one direction. For the purpose of this example, the focus metrology pattern T is periodic in the Y direction, which corresponds to the scanning direction of the lithographic apparatus. In a lithographic apparatus of the type described, the direction of illumination is at an oblique angle, within the Y-Z plane. The focus metrology pattern T is made periodic in this Y direction, to exploit the asymmetry in the imaging process, caused by this obliqueness of illumination. By measuring asymmetry in the printed focus metrology pattern, for example using an inspection apparatus of the type described above, a measurement of focus performance can be derived.

Patterning device MA comprises reflective and non-reflective portions to define features of one or more device patterns and one or more metrology patterns. As one type of metrology pattern of interest for the present disclosure, a focus metrology pattern T to be formed on the substrate W is defined by a corresponding pattern T" formed on reflective patterning device MA. An enlarged detail of part of the reticle is shown at 402. The printing operation which transfers this pattern onto a resist layer on substrate W is performed in the lithographic apparatus of FIG. 1 by illuminating the reticle with EUV radiation 404 radiation incident at an oblique angle θ, which may be for example in the range of 5° to 10°. Reflected radiation 406 carrying information of the metrology target pattern (and all the product features desired to be printed on the substrate) enters the projection system PS. The basis of the reticle is a reflective structure 408, which is typically a multilayer structure, adapted to reflect a wavelength of radiation used in the lithographic apparatus. The EUV radiation is typically shorter than 20 nanometers. For example, a wavelength of approximately 13.5 nm is used in current implementations based on a tin plasma radiation source.

On top of the reflective structure 408, radiation-absorbent structure 410 is provided, which may comprise a layer of EUV-absorbing material, and optionally a protective capping layer. Structure 410 is selectively removed so as to leave reflecting portions 412, 414 and non-reflecting portions 416, in accordance with the pattern that is desired to be printed on the substrate. Depending on the type of resist material used, the developed pattern may have resist features corresponding to the reflective portions (negative tone resist) or to the non-reflective portions (positive tone resist). For the present illustration, a positive resist process will be assumed, but the teaching of the present disclosure can really be adapted by the skilled person to either type of process.

Focus metrology pattern T comprises a grating pattern with the length L in a direction of periodicity. The direction of periodicity in this example is the Y direction, as mentioned. The period P of the structure is marked, and an enlarged portion of the pattern including one of the repeating units 420 is shown. Each repeating unit comprises a group of one or more first features 422 and one or more second features 424. Each group of the first features 422 in this example comprises a two-bar structure defined by the narrow reflecting portions 412 on the reticle portion 402. The skilled person will understand that the projection system PS of a typical lithographic apparatus will apply a predetermined de-magnification factor when printing the pattern from the patterning device MA onto the substrate W. Accordingly, the dimensions of features given in the following examples will be understood to refer to the sizes of features as printed on the substrate, and the sizes of the corresponding features on the patterning device such as reticle 402 will be physically several times larger. This scaling factor should be taken for granted in the following description, and will not be mentioned again.

The wavelength of radiation used in the printing step, for example EUV radiation, is much shorter than the wavelengths of radiation typically used to measure asymmetry in the inspection apparatus of FIG. 3. EUV radiation may be defined as radiation in the range 0.1 nm to 100 nm while the wavelength of radiation used in the printing step may be for example less than 20 nanometers. The inspection apparatus in some embodiment may use visible or infrared radiation at one or more wavelengths in the range 350 to 800 nm. The wavelength of radiation used in the printing step may be in such cases ten or more times shorter than the wavelength of radiation used in the measuring of asymmetry. In other examples, the wavelength of the measuring radiation may be shorter than 350 nm, for example in the range 200-350 nm or even 100 nm to 200 nm.

Whichever radiation wavelengths are used for the printing of the pattern and the measuring of it, the focus metrology pattern contains features with a range of properties adapted to suit these conditions. The first features 422 are designed to have a dimension similar to the smallest features printed as part of the product patterns. If this were not so, then focus performance measured using the focus metrology pattern T might not accurately represent focus performance in the actual product features of interest. Each group of first features may therefore comprise two or more bars or other features each having a dimension CD less than 50 nanometers in the direction of periodicity. In one example the line width of these features might be 22 nm. The spacing between the first features may also be less than 50 nm, and the same as or similar to the dimension CD of each first feature, for example 22 nm.

On the other hand, in view of the longer wavelengths used in the inspection apparatus (even allowing for the fact that inspection apparatus using shorter wavelengths might be applied), these individual first features are too small to be resolved directly by the inspection apparatus. By arranging groups of first features in a grating pattern having an overall pitch P that is comparable to the inspection apparatus wavelength, a diffraction spectrum of the pattern as a whole becomes accessible to the inspection apparatus, and properties of the smaller features can be inferred. The pitch P of the grating pattern may for example be 600 nm. The overall length L of the grating pattern may be, for example, 5 μm. Such a size allows the pattern to be included within device areas, but still resolved using the dark-field imaging branch of the inspection apparatus of FIG. 3. (If measurements are to be made using the pupil imaging branch, then a larger target is typically required, so that the illumination spot S can be placed entirely within the grating.)

Putting these dimensions together, it will be appreciated that the spacing S1 between adjacent groups of first features 422 is much greater than the spacing S0 between the first features within each group. Spacing S1 may be, for example, over four times, over five, six, eight or ten times the spacing between the first features within the group. In the illustrated example, with a pitch P of 600 nm and a linewidth 22 nm for the first features, the spacing S1 may be over 500 nm. Generally speaking, the skilled person in imaging technology will consider that features are effectively isolated, if the space between them is five or six times dimensions of the features themselves.

Spacing between groups of first features is not necessarily empty. In the illustrated example, as an optional feature, second features 424 are defined by broader reflecting portions 414 on the reticle. Broad spaces between the first features and (optionally) the second features are defined by non-reflecting portions 416. In other words, the focus metrology pattern T in this example further comprises second features arranged between the adjacent groups of first features. The second features are distinguished from the first features in that each second feature having a dimension greater than the dimension of the first features in the direction of periodicity. In one example, the width of each second feature 424 may be on the order of 100 nm. Given the overall grating pitch of 600 nm, the spacing S2 between a group of first features and an adjacent second feature is (in this example) still several times greater than the spacing between first features within each group of first features. Spacing S2 may be, for example, over four times, over five, six, eight or ten times the spacing S0 between the first features within each group.

FIG. 5 illustrates various focus metrology patterns that may be used, and of course other examples can be envisaged, based on the principles disclosed herein. In all of the examples, only a small section of the pattern is shown, including a repeating unit with pitch P. The example of FIG. 5 (a) comprises only groups of first features 422, in which a spacing S1 between the groups of first features much greater than the dimension (linewidth) CD of each first features in the direction of periodicity, and much greater than the spacing S0 between the first features within each group. This example is similar to the pattern illustrated in FIG. 4, but with second features omitted. It will be understood that, to realize this pattern using a reflective reticle 402, the reflective portion 414 will be omitted. In some embodiments, the bars that are the first features 422 will be defined by narrow non-reflective portions on the reticle, within a generally reflective background, whereas in other embodiments the first features 422 may be defined by reflective bars 412 within a generally non-reflective background. In either case, the choice of positive tone resist or negative tone resist will determine whether these first features are represented as remaining resist in the developed focus metrology pattern, or whether they are represented as absence of resist. The principles of the disclosure are the same in all these variations.

Figure 6A:
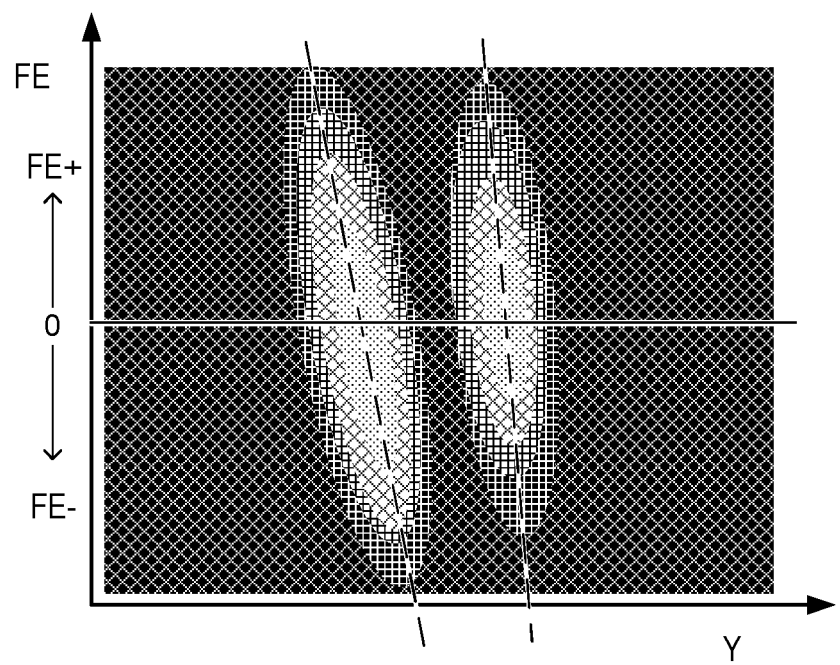
FIGS. 6A-6B illustrate (a) the formation of an aerial image of an isolated two-bar feature when printing a focus metrology pattern in the lithographic apparatus of FIG. 1 and (b) a simulation of the relationship between a measurable parameter of the focus metrology pattern and focus.
Figure 6B:
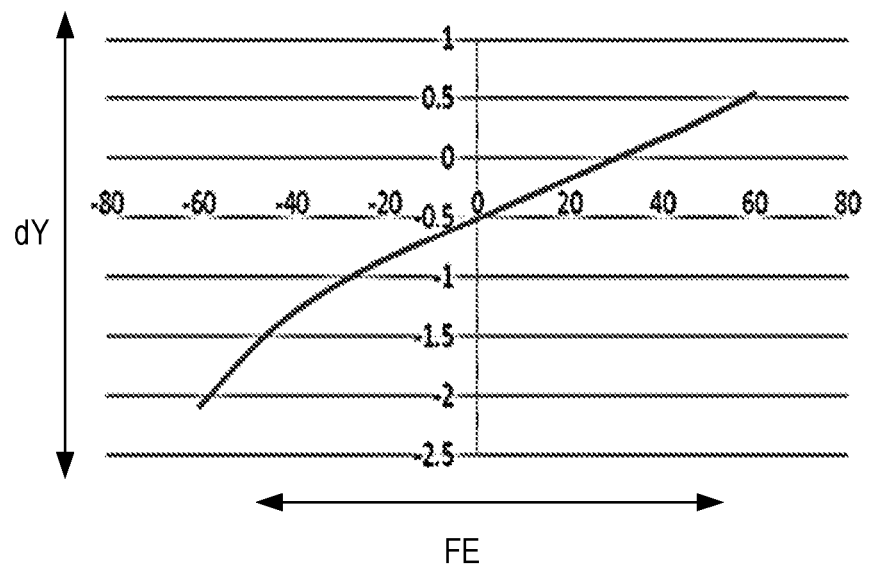

Considering the three-dimensional nature of the reticle 402, in combination with the shadowing effect of the non-perpendicular illumination 404, the projection system PS of the lithographic apparatus prints the first features of the focus metrology pattern in a manner that is dependent on focus. FIG. 6 (a) illustrates schematically the form of an "aerial image" formed by the projection system in the vicinity of the resist. The vertical axis represents focus error FE in a Z direction in the vicinity of the substrate surface where a radiation-sensitive resist coating has been applied. The horizontal axis represents the Y direction, which is also the direction of periodicity of the grating pattern T. The aerial image for a single two-bar feature is shown, it being understood that this pattern repeats across the area of the printed grating.

As is well known in imaging practice, the printed pattern is best defined in a plane of focus, represented by zero focus error. Above and below the plane of focus, the intensity of the aerial image is less. Due to the three-dimensional nature of imaging using the reflective optics of an EUV lithographic apparatus, however, the aerial image not only weakens above and below the plane of best focus, but also is distorted, so that the aerial image of each individual feature is tilted. This is indicated schematically by the dashed lines, and it will be seen that each bar of the two-bar feature has a different tilt in its aerial image, and the edges of the printed bar will exhibit different sensitivities to focus error as a result. The illustration provided is only approximate, and yet further effects arise in the real aerial image.

Depending on the dominant mechanisms by which asymmetry in the first features arises, it may be expected that the resist profile of an isolated two-bar pattern will exhibit a stronger focus-dependent asymmetry than either single bar a pattern having three, four or more bars in close proximity. Nevertheless, the present disclosure is not limited to two-bar patterns, and each group of first features may comprise any number of first features, including just a single first features. As will be illustrated below, asymmetry of the resist profile of the first features themselves is not the only mechanism by which asymmetry can be introduced in the focus metrology pattern.

Accordingly, returning to the two-bar example, an error in focus can be measured by providing a pattern having isolated two-bar features of the type illustrated, and measuring asymmetry in the printed pattern. Moreover, as seen in the graph of FIG. 6 (b), the effective position of the printed bars is displaced by an amount dY which varies with the focus error FE. If the focus metrology pattern is designed so that displacement of narrow bar features can be measured, a measurement of focus can be obtained by measuring this displacement. The illustrated graph is based on a simulation using the example of FIG. 5 (b), which will be recognized also as the example illustrated in FIG. 4. One way to allow the displacement dY to be measured is to provide broader features such as the second features 424 in that example pattern. The displacement results in an asymmetry in the grating pattern formed in the resist, so that a measurement of focus performance can be derived from a measurement of asymmetry, whichever of the examples is used.

Another way to interpret the differential displacement between narrow features and broad features is to regard the grating pattern as having features of the first spatial frequency and a second spatial frequency. Gratings of different spatial frequency (pitch) will experience a different placement as focus varies. In conclusion, asymmetry can be introduced into the printed pattern by exploiting either or both of two distinct effects: distortion of the pattern features themselves, and differential displacement of the narrow and broad features. While measuring asymmetry is one way of measuring the relative displacement between two types of features, any method that measures the displacement of the first features can be deployed. This may be a method that measures relative displacement between the different types of features by some method other than asymmetry. It may be a method that measures the displacement of the first features relative to some other reference. In other words, measurement of asymmetry in a printed pattern is only one convenient method of measuring the focus-dependent distortion and/or displacement of the pattern obtained using the patterning device with first features. Other methods may be deployed, if preferred.

Returning to FIG. 5, another example focus metrology pattern is illustrated at (c). This example has the same properties as the pattern of FIG. 5 (b), except that groups of second features 424 are provided between the groups of first features, rather than only a single second feature. Again, each group of first features in this example comprises a two-bar pattern, just by way of example. As in the previous examples, spacing between the groups of first features 422 is much greater than spacing between first features within the group. Additionally, spacing between each group of first features and the adjacent group of second features 424 is also much greater than the spacing between first features within each group.

In this example, the differential displacement of groups of features with narrow and broader dimensions creates an asymmetry signal that can be measured as a representation of focus. Compared with the previous examples, measurement on this target may be less sensitive to changes in the pattern caused by process variations other than focus. On the other hand there may be some loss of sensitivity to focus. The appropriate target design can be chosen based on a compromise of these factors. While the first features may have a dimension CD corresponding to the narrowest features forming part of the product patterns to be printed on the substrate, the second features may have a dimension CD2 corresponding to some other features of the product pattern. It will be understood that proper registration between features of different dimensions in the same product pattern may be important to performance in the finished product.

In another example, illustrated in FIG. 5 (d), the focus metrology pattern comprises a grating structure in which a group of narrow first features 422 substantially fills the spaces in a grating formed by broader second features 424. In other words, in this example, a spacing S2 between a group of first features and an adjacent second feature is similar to the dimension CD1 of each first feature in the direction of periodicity. and similar to the spacing S0 between first features within each group. At the same time, the spacing S1 between groups of first features remains much greater than the spacing between individual first features within each group.

Figure 7:
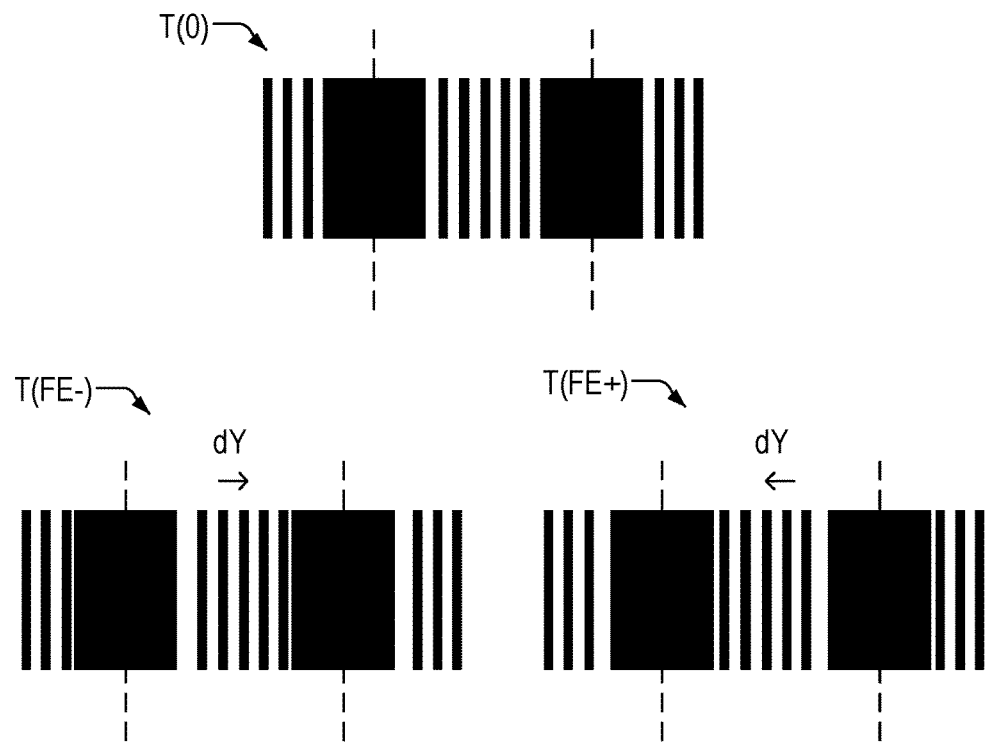
FIG. 7 illustrates the introduction of focus dependent asymmetry when printing a focus metrology pattern of the type shown in FIG. 5(d)

Referring now to FIG. 7, we illustrate the effect of differential displacement affecting the first features and the second features in the example focus metrology pattern of FIG. 5 (d). A pattern T(0) is printed, exactly as illustrated in FIG. 5 (d). This pattern may correspond exactly to the pattern of reflective and non-reflective portions on a suitably modified reticle 402. As already demonstrated, however, narrow features and broad features will become distorted and/or shifted when printed with a degree of focus error.

Accordingly, a slightly different pattern T(FE−) will be printed on the substrate, when a negative focus error is present. The narrow lines which are the first features become shifted by a small differential displacement dY relative to the broad lines, as illustrated. Similarly, another different pattern T(FE+) will be printed on the substrate, when a positive focus error is present. The narrow lines which are the first features become shifted by a small differential displacement dY in the opposite direction. While the shifts in this illustration may be exaggerated, it will be seen that the differential displacement of the first features and second features introduces an asymmetry in the printed pattern, that is not present in the "ideal" printed pattern T(0). Measurement of the asymmetry in this pattern can therefore yield a measurement of focus error.

Figure 8:
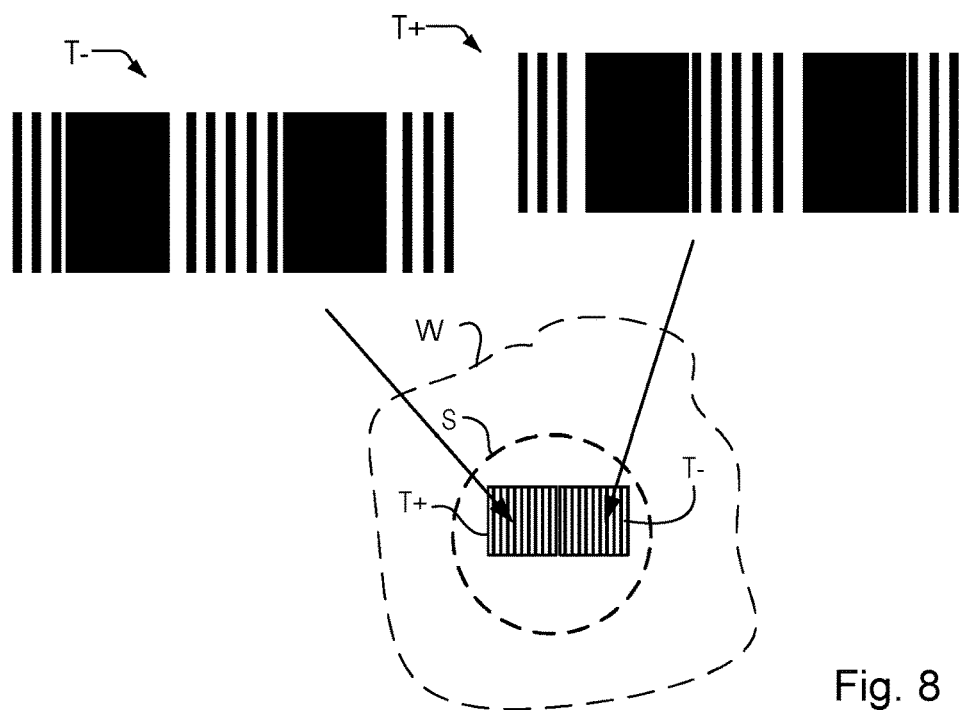
FIG. 8 shows the formation of a composite focus metrology target comprising a pair of biased focus metrology patterns of the type shown in FIG. 5(d)
Figure 9:
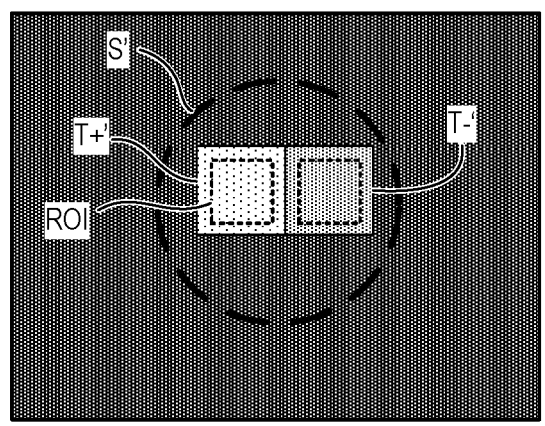
FIG. 9 shows a dark-field image of the metrology focus patterns of the target of FIG. 8, obtained using the apparatus of FIG. 3.

In some embodiments, as illustrated in FIG. 8, two or more similar focus metrology patterns are printed in the same step. These patterns are "biased", meaning that they are identical except for a programmed offset in the positioning of the first features relative to the second features. FIG. 8 shows a pair of focus metrology patterns T+ and T−. These are printed side by side and may, for example, be imaged simultaneously using radiation spot S in the dark field imaging mode of the inspection apparatus of FIG. 3. In other words, measurements of asymmetry in both of these focus metrology patterns can be taken by taking first and second images using the +1 and −1 order diffracted radiation collected by the apparatus. One such image is shown in FIG. 9. The dark rectangle represents the dark-field image as recorded on sensor 23 in the apparatus of FIG. 3, for example. A circle S' indicates the area of radiation spot S, imaged onto the detector. Brighter rectangles T−' and T+' represent the images of the pair of focus metrology patterns T− and T+. The intensity of one diffraction order from each target can be measured by, for example, defining a region of interest ROI within each of the brighter rectangles, and averaging the pixel values. Repeating this for the opposite diffraction order allows asymmetry to be calculated. In an alternative measurement method using the prisms 21b shown in FIG. 3, then effectively both images of both patterns can be captured simultaneously.

It will be noted that each of the patterns shown in FIG. 8 is "pre-programmed" with a displacement (offset) of the first features relative to the second features. Accordingly, under zero focus error, the pattern T− will be printed looking something like the pattern T(FE−) in FIG. 7. As focus error varies in the positive direction, the pattern will be printed more like the neutral or nominal pattern T(0), and its asymmetry will decrease. Conversely, under zero focus error, the pattern T+ will be printed looking something like the pattern T(FE+) in FIG. 7. Its asymmetry will decrease as focus error varies in the negative direction. In diffraction based measurements of focus and/or overlay in the known techniques, the use of two or more biased targets allows differential measurements of asymmetry to be obtained. Combining these differential measurements with the knowledge of the programmed offsets allows a measurement of focus error to be derived, while canceling out other process-dependent variables. As illustrated now in the example of FIG. 8, biased targets can be designed to obtain the same benefit in the focus metrology patterns of the present disclosure.

The method relies on the fact that there is a known relation between the asymmetry (or other property) of the target and the focus error during exposure (printing). This relation should be a monotonically varying function (i.e. the sign of the asymmetry should be different for positive and negative focus). When this relation is known (for instance by computational means), two targets can be designed that mimic the behaviour for positive and negative focus. The actual focus position can now be extracted from the asymmetry measurements on the two targets.

Returning to FIG. 5, another example focus metrology pattern is illustrated at (e). The focus metrology pattern comprising groups of first features 422 in this example is printed in registration with an array of second features printed in a separate printing step on the same substrate. As is well known, a typical lithographic manufacturing process involves the printing of many different patterns in successive layers, to define ultimately the structure of a functional product. In the illustrated example, the second features 424 are printed in a different layer on the substrate, above or below the first features 422. In other words, features are provided on one patterning device to define the first features of the focus metrology pattern, and features are provided on another patterning device to define the second features. In other examples, patterns printed in separate printing steps may be combined in the same layer, so that any of the examples (b), (c), (d) could be printed in separate steps. As before, differential displacement of the first features relative to the second features will lead to asymmetry in the printed pattern. This differential displacement will also include of course and overlay error between the two printing steps. Other metrology targets printed nearby can be used to measure this overlay, and the actual overlay error can be subtracted from the one measured on the focus metrology patterns, to isolate the differential displacement that is associated with focus error. Since the second features are much broader than the first features, they are relatively insensitive to focus error, and their positioning. Accordingly, it will be understood that it is the printing step which is used to print the focus metrology pattern that includes the first features, that is the one whose focus error is measured.

Figure 10:
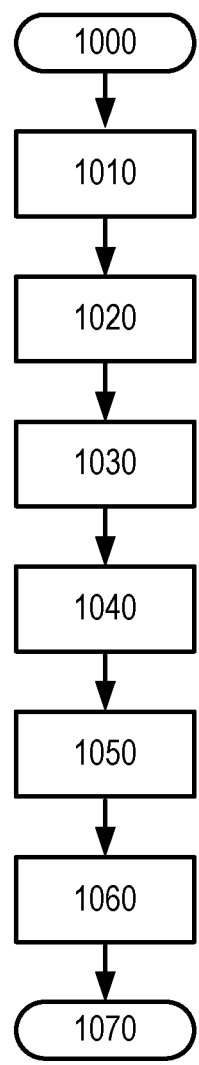
FIG. 10 is a flowchart of a method of monitoring focus according to an embodiment of the invention.

FIG. 10 is a flowchart of the steps of a method for measuring focus performance of a lithographic process according to an exemplary embodiment. The method can be performed using any of the example focus metrology patterns described above and illustrated in the drawings. The steps are as follows, and are then described in greater detail thereafter:

1000—Start by defining a product design with metrology targets, and preparing a suitable set of patterning devices (reticles).

1010—Print one or more focus metrology patterns alongside product patterns on a substrate;

1020—Measure intensity of a portion of the diffraction spectrum of each focus metrology pattern using a suitable inspection apparatus (for example the +1 order is a suitable portion of the diffraction spectrum);

1030—Measure intensity of an opposite portion of the diffraction spectrum (for example, −1 order) of each focus metrology pattern using the inspection apparatus;

1040—Calculate measurements of asymmetry of one or more focus metrology patterns by comparing the intensities of the opposite diffraction orders;

1050—Using the asymmetry measurements, optionally with knowledge of programmed offsets between focus metrology patterns and/or other measurements such as actual overlay performance, calculate focus error at the time of printing the focus metrology pattern.

1060—Use the derived focus measurement in focus setting for exposures on subsequent substrates.

1060—End or repeat.

As already explained, step 1020 and step 1030 may be performed as a single step such that the opposite diffraction orders of a focus metrology pattern can be obtained in a single acquisition. In addition, where there are more than two targets being measured, all the targets may be measured in a single acquisition to obtain a corresponding number of measurement values.

Although the measurement steps are shown being made by a scatterometer, as a dedicated inspection apparatus, this may be a stand-alone apparatus or it may be integrated in the lithocell. Moreover, asymmetry measurements can be made without dedicated metrology apparatus, for example using suitable targets with the alignment sensors provided in the lithographic apparatus.

Calculation steps 1040 and 1050 can all be performed in a processor of the inspection apparatus, or may be performed in different processors associated with monitoring and control of the lithographic apparatus. Each step may be performed by a programmed processor, and it is an advantage of the techniques disclosed, that the inspection apparatus can be modified to perform the focus measurement methods without hardware modification.

CONCLUSION

In conclusion, a method of manufacturing devices using the lithographic process can be improved by performing focus measurement methods as disclosed herein, using it to measure processed substrates to measure parameters of performance of the lithographic process, and adjusting parameters of the process (particularly focus) to improve or maintain performance of the lithographic process for the processing of subsequent substrates.

While the target structures including and focus metrology patterns described above are metrology targets specifically designed and formed for the purposes of measurement, in other embodiments, properties may be measured on targets which are functional parts of devices formed on the substrate. Many devices have regular, grating-like structures. The terms "metrology pattern" and "metrology target" and the like as used herein do not require that the structure has been provided specifically for the measurement being performed.

In association with the physical grating structures defining the focus metrology patterns as realized on substrates and patterning devices, an embodiment may include a computer program containing one or more sequences of machine-readable instructions describing a methods of designing focus metrology patterns, metrology recipes and/or controlling the inspection apparatus to implement the illumination modes and other aspects of those metrology recipes. This computer program may be executed for example in a separate computer system employed for the design/control process. As mentioned, calculations and control steps may be wholly or partly performed within unit PU in the apparatus of FIG. 3, and/or the control unit LACU of FIG. 2. There may also be provided a data storage medium (e.g., semi-conductor memory, magnetic or optical disk) having such a computer program stored therein.

Further embodiments according to the present invention are provided in below numbered clauses:

1. A method of measuring focus performance of a lithographic apparatus, the method comprising:

(a) using the lithographic apparatus to print at least one focus metrology pattern on a substrate, the printed focus metrology pattern comprising an array of features that is periodic in at least one direction;

(b) measuring a property of the printed focus metrology pattern; and (c) deriving a measurement of focus performance from the measurement of said property, wherein the focus metrology pattern is defined by a patterning device and the printing in step (a) is performed by illuminating said patterning device with patterning radiation incident at an oblique angle, and wherein the focus metrology pattern comprises a periodic array of groups of first features, each group comprising one or more first features and wherein a spacing between adjacent groups of first features within the focus metrology pattern is much greater than the dimension of each first feature in the direction of periodicity.

2. A method according to clause 1 wherein the spacing between adjacent groups of first features is greater than four times the dimension of each first feature in the direction of periodicity.

3. A method according to clause 1 or 2 wherein step (b) comprises measuring asymmetry as a property of the printed pattern by measuring asymmetry of a diffraction spectrum of the focus metrology pattern.

4. A method according to clause 1, 2 or 3 wherein a wavelength of radiation used in the printing step (a) is shorter than a wavelength of radiation used in the measuring step (b).

5. A method according to clause 4 wherein the wavelength of radiation used in the printing step is less than 20 nanometers and the wavelength used in the measuring step is greater than 100 nanometers, the first features each having a dimension less than 50 nanometers in the direction of periodicity.

6. A method according to any preceding clause wherein each group of first features comprises two or more first features, the spacing between adjacent groups of first features being much greater than a spacing between said first features within each group.

7. A method according to any preceding clause wherein each of said groups of first features comprises exactly two first features.

8. A method according to any preceding clause wherein the focus metrology pattern further comprises second features arranged between the adjacent groups of first features, each second features having a dimension greater than the dimension of the first features in the direction of periodicity.

9. A method according to clause 8 wherein groups of two or more second features are arranged between the adjacent groups of first features.

10. A method according to clause 8 or 9 wherein a spacing between a group of first features and an adjacent second feature is greater than four times the dimension of each first feature.

11. A method according to clause 8 or 9 wherein a spacing between a group of first features and an adjacent second feature is similar to the dimension of each first feature in the direction of periodicity.

12. A method according to any of clauses 1 to 7 wherein the focus metrology pattern comprising groups of first features is printed in registration with an array of second features printed in a separate printing step on the same substrate.

13. A method according to clause 12 wherein the second features are printed in a different layer on the substrate, above or below the groups of first features.

14. A method according to any preceding clause wherein said focus metrology pattern is one of two or more similar focus metrology patterns printed in the same step (a), said two or more focus metrology patterns being identical except for a programmed offset in the positioning of the first features relative to the second features.

15. A patterning device for use in a lithographic apparatus, the patterning device comprising reflective and non-reflective portions to define features of one or more device patterns and one or more metrology patterns, the metrology patterns including at least one focus metrology pattern, the focus metrology pattern comprising a periodic array of groups of first features, each group comprising one or more first features and wherein a spacing between adjacent groups of first features within the focus metrology pattern is much greater than the dimension of each first feature in the direction of periodicity.

16. A patterning device according to clause 15 wherein the spacing between adjacent groups of first features is greater than four times the dimension of each first feature in the direction of periodicity.

17. A patterning device according to clause 15 or 16 wherein said reflective portions are adapted to reflect a wavelength of radiation used in the lithographic apparatus that is shorter than 20 nanometers and wherein each first feature has a dimension less than 50 nanometers in the direction of periodicity, when printed by said lithographic apparatus.

18. A patterning device according to clause 17 wherein a period of the focus metrology pattern when printed by the lithographic apparatus is greater than 100 nanometers.

19. A patterning device according to any of clauses 15 to 18 wherein each group of first features comprises two or more first features.

20. A patterning device according to any of clauses 15 to 19 wherein each of said groups of first features comprises exactly two first features.

21. A patterning device according to any of clauses 15 to 20 wherein the focus metrology pattern further comprises second features arranged between the adjacent groups of first features, each second feature having a dimension greater than the dimension of the first features in the direction of periodicity, and wherein a spacing between a group of first features and an adjacent second feature is greater than four times the dimension of each first feature.

22. A patterning device according to clause 21 adapted to define groups of two or more second features, the groups of second features being arranged between the adjacent groups of first features.

23. A patterning device according to any of clauses 5 to 20 wherein the focus metrology pattern further comprises groups of two or more second features arranged between the adjacent groups of first features, each second feature having a dimension greater than the dimension of the first features in the direction of periodicity, and wherein a spacing between a group of first features and an adjacent second feature is similar to the spacing between first features within the group.

24. A patterning device according to any of clauses 15 to 20 in combination with a second patterning device defining second features, such that the focus metrology pattern comprising groups of first features is printed in registration with an array of second features printed in a separate printing step on the same substrate.

25. A patterning device according to any of clauses 21 to 24 wherein said focus metrology pattern is one of two or more similar focus metrology patterns defined by the same patterning device, said two or more focus metrology patterns being identical except for a programmed offset in the positioning of the first features relative to the second features.

26. A metrology apparatus for measuring a parameter of a lithographic process, the metrology apparatus being operable to perform steps (b) and (c) of the method of any of clauses 1 to 14.

27. A metrology apparatus according to clause 26 comprising:
a support for said substrate having a plurality of targets thereon;
an optical system for capturing radiation scattered by each target; and
a processor for deriving said measurement of focus performance of the lithographic process based on asymmetry in the captured scattered radiation.

28. A lithographic system comprising:
a lithographic apparatus comprising:
an illumination optical system arranged to illuminate a reflective patterning device;
a projection optical system arranged to project an image of the patterning device onto a substrate; and
a metrology apparatus according to clause 26 or 27,
wherein the lithographic apparatus is arranged to use the measurement of focus performance derived by the metrology apparatus when applying the pattern to further substrates.

29. A computer program comprising processor readable instructions which, when run on suitable processor controlled apparatus, cause the processor controlled apparatus to perform steps (b) and/or (c) the method of any one of clauses 1 to 14.

30. A computer program carrier comprising the computer program of clause 29.

31. A method of manufacturing devices wherein a device pattern is applied to a series of substrates using a lithographic process, the method including:
using the method of any of clauses 1 to 14 to measure focus performance of the lithographic process, and
controlling the lithographic process for later substrates in accordance with the measured focus performance.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodiments, but should be defined only in accordance with the following claims and their equivalents.

The invention claimed is:

1. A method of measuring focus performance of a lithographic apparatus, the method comprising:
illuminating reflective and non-reflective portions of a patterning device with EUV radiation incident to the patterning device at an oblique angle to define a printed focus metrology pattern, wherein the non-reflective portions of the patterning device comprise first features and second features, both the first features and the second features being periodic in at least one direction, wherein each second feature is arranged between groups of the first features in an alternating manner, each of the second features having a dimension greater than a dimension of each of the first features and spaced apart from any adjacent group of the first features by a dimension larger than the dimension of each of the first features, and wherein the first features being positioned based on a focus of a lithographic apparatus that performs the illuminating;
measuring a shift along the at least one direction of periodicity of at least one group of the first features associated with the printed focus metrology pattern; and
deriving a measurement of focus performance from the measurement of the shift.

2. The method as claimed in claim 1 wherein the spacing between adjacent groups of first features is greater than four times the dimension of each first feature in the direction of periodicity.

3. The method of claim 1, wherein the measuring comprises measuring asymmetry as a property of the printed pattern by measuring asymmetry of a diffraction spectrum of the focus metrology pattern.

4. The method of claim 1, wherein a wavelength of radiation used in the printing is shorter than a wavelength of radiation used in the measuring.

5. The method of claim 1, wherein the spacing between adjacent groups of first features is greater than a spacing between the first features within each group of first features.

6. The method claim 1, wherein each of the groups of first features comprises exactly two first features.

7. The method of claim 1, wherein the focus metrology pattern comprising groups of first features is printed in registration with an array of second features printed in a separate printing on the same substrate.

8. A patterning device for use in a lithographic apparatus, the patterning device comprising:
reflective and non-reflective portions to define features of one or more device patterns and one or more metrology patterns, wherein the non-reflective portions of a patterning device comprise first features and second features, both the first features and the second features being periodic in at least one direction, wherein each second feature is arranged between groups of the first features in an alternating manner, each of the second features having a dimension greater than a dimension of each of the first features and spaced apart from any adjacent group of the first features by a dimension larger than the dimension of each of the first features, and
wherein printing is performed by illuminating the patterning device with patterning radiation incident at an oblique angle to define a printed focus metrology pattern thereby obtaining a positioning of the first features being dependent on a focus of the lithographic apparatus such that a shift along the at least one direction of periodicity of at least one group of the first features associated with the printed focus metrology pattern is measured to derive focus performance of the lithographic apparatus based on the shift.

9. The patterning device of claim 8, wherein the spacing between adjacent groups of first features is greater than four times the dimension of each first feature in the direction of periodicity.

10. The patterning device of claim 8, wherein:
the reflective portions are adapted to reflect a wavelength of radiation used in the lithographic apparatus that is shorter than 20 nanometers; and
wherein each first feature has a dimension less than 50 nanometers in the direction of periodicity, when printed by the lithographic apparatus.

11. The patterning device of claim 8, wherein each group of first features comprises two or more first features.

12. The patterning device of claim 8, wherein each of the groups of first features comprises exactly two first features.

13. The patterning device of claim 8, wherein:
the focus metrology pattern further comprises groups of two or more second features arranged between the adjacent groups of first features, each second feature having a dimension greater than the dimension of the first features in the direction of periodicity, and
a spacing between a group of first features and an adjacent second feature is similar to the spacing between first features within the group.

14. The patterning device of claim 8, in combination with a second patterning device defining second features, such that the focus metrology pattern comprising groups of first features is printed in registration with an array of second features printed in a separate printing step on the same substrate.

15. A lithographic system comprising:
a lithographic apparatus comprising:
an illumination optical system arranged to illuminate a reflective patterning device;
a projection optical system arranged to project an image of the patterning device onto a substrate; and
a metrology apparatus configured to:
use the lithographic apparatus to print at least one focus metrology pattern on the substrate, the printed focus metrology pattern with reflective and non-reflective portions of a patterning device, the non-reflective portions having first features and second features, both the first features and the second features being periodic in at least one direction, wherein each second feature is arranged between groups of the first features in an alternating manner, each of the second features having a dimension greater than a dimension of each of the first features and spaced apart from any adjacent group of the first features by a dimension larger than the dimension of each of the first features, and wherein the first features being positioned are based on a focus of the lithographic apparatus that performs the illuminating;
measure a shift along the at least one direction of periodicity of at least one group of the first features associated with the printed focus metrology pattern; and
derive a measurement of focus performance from the measurement of the shift,
wherein the lithographic apparatus is arranged to use the measurement of focus performance derived by the metrology apparatus when applying the pattern to further substrates, and
wherein printing is performed by illuminating the patterning device with patterning radiation incident at an oblique angle thereby obtaining the shift of the first features being dependent on a focus of the lithographic apparatus.

16. A non-transitory computer-readable media comprising processor readable instructions which, when run on suitable processor controlled apparatus, cause the processor controlled apparatus to perform operations comprising:
illuminating reflective and non-reflective portions of a patterning device with EUV radiation incident to the patterning device at an oblique angle to define a printed focus metrology pattern, wherein the non-reflective portions of the patterning device comprise first features and second features, both the first features and the second features being periodic in at least one direction, wherein each second feature is arranged between groups of the first features in an alternating manner, each of the second features having a dimension greater than a dimension of each of the first features and spaced apart from any adjacent group of the first features by a dimension larger than the dimension of each of the first features, and wherein the first features being positioned based on a focus of a lithographic apparatus that performs the illuminating;
measuring a shift along the at least one direction of periodicity of at least one group of the first features associated with the printed focus metrology pattern; and
deriving a measurement of focus performance from the measurement of the shift.

17. A method of manufacturing devices wherein a device pattern is applied to a series of substrates using a lithographic process, the method measure focus performance of the lithographic process comprising:
illuminating reflective and non-reflective portions of a patterning device with EUV radiation incident to the patterning device at an oblique angle to define a printed focus metrology pattern, wherein the non-reflective portions of the patterning device comprise first features and second features, both the first features and the second features being periodic in at least one direction, wherein each second feature is arranged between groups of the first features in an alternating manner, each of the second features having a dimension greater than a dimension of each of the first features and spaced apart from any adjacent group of the first features by a dimension larger than the dimension of each first feature, and wherein the first features being positioned based on a focus of a lithographic apparatus that performs the illuminating;
measuring a shift along the at least one direction of periodicity of at least one group of the first features associated with the printed focus metrology pattern;
deriving a measurement of focus performance from the measurement of the shift; and
controlling the lithographic process for later substrates in accordance with the measured focus performance.

* * * * *